United States Patent
Kesler et al.

(10) Patent No.: US 12,046,876 B2
(45) Date of Patent: Jul. 23, 2024

(54) VERTICALLY OFFSET VERTICAL CAVITY SURFACE EMITTING LASERS

(71) Applicant: Lumentum Operations LLC, San Jose, CA (US)

(72) Inventors: Benjamin Kesler, Sunnyvale, CA (US); Guowei Zhao, Milpitas, CA (US)

(73) Assignee: Lumentum Operations LLC, San Jose, CA (US)

( * ) Notice: Subject to any disclaimer, the term of this patent is extended or adjusted under 35 U.S.C. 154(b) by 128 days.

(21) Appl. No.: 17/453,060

(22) Filed: Nov. 1, 2021

(65) Prior Publication Data
US 2023/0102622 A1 Mar. 30, 2023

Related U.S. Application Data

(60) Provisional application No. 63/261,697, filed on Sep. 27, 2021, provisional application No. 63/261,699, filed on Sep. 27, 2021.

(51) Int. Cl.
- H01S 5/42 (2006.01)
- H01S 5/042 (2006.01)
- H01S 5/183 (2006.01)
- H01S 5/34 (2006.01)

(52) U.S. Cl.
CPC ............ H01S 5/426 (2013.01); H01S 5/0421 (2013.01); H01S 5/18305 (2013.01); H01S 5/18397 (2013.01); H01S 5/3416 (2013.01)

(58) Field of Classification Search
CPC ...... H01S 5/4087; H01S 5/4093; H01S 5/423; H01S 5/426
See application file for complete search history.

(56) References Cited

U.S. PATENT DOCUMENTS

| | | | |
|---|---|---|---|
| 5,754,578 A * | 5/1998 | Jayaraman | H01S 5/426 372/75 |
| 5,892,787 A * | 4/1999 | Tan | H01L 33/0016 372/45.01 |
| 5,914,976 A | 6/1999 | Jayaraman et al. | |
| 6,222,206 B1 | 4/2001 | Chirovsky et al. | |
| 6,493,372 B1 * | 12/2002 | Boucart | H01S 5/426 372/50.1 |

(Continued)

OTHER PUBLICATIONS

Harris et al., "Emerging application for vertical cavity surface emitting lasers," Semicond. Sci. Technology, vol. 26, 2011, 11 Pages.

Primary Examiner — Michael Carter
(74) Attorney, Agent, or Firm — Harrity & Harrity, LLP

(57) ABSTRACT

A vertical cavity surface emitting laser (VCSEL) device may include a substrate layer and a first set of epitaxial layers, for a first VCSEL, disposed on the substrate layer. The first set of epitaxial layers may include a first set of mirrors and at least one first active layer. The VCSEL device may include a second set of epitaxial layers, for a second VCSEL, disposed on the first set of epitaxial layers for the first VCSEL. The second set of epitaxial layers may include a second set of mirrors and at least one second active layer. The first VCSEL and the second VCSEL may be configured to emit light in a light emission direction. The at least one first active layer of the first VCSEL may be offset in the light emission direction from the at least one second active layer of the second VCSEL.

20 Claims, 6 Drawing Sheets

(56) References Cited

U.S. PATENT DOCUMENTS

| | | | |
|---|---|---|---|
| 6,583,445 B1 | 6/2003 | Reedy et al. | |
| 6,608,846 B1* | 8/2003 | Fischer | H01S 5/426 |
| | | | 372/50.1 |
| 10,120,149 B1* | 11/2018 | Mathai | G02B 6/29365 |
| 2002/0075929 A1* | 6/2002 | Cunningham | H01S 5/041 |
| | | | 372/50.1 |
| 2002/0093024 A1 | 7/2002 | Lee et al. | |
| 2002/0094589 A1 | 7/2002 | Chirovsky et al. | |
| 2004/0096996 A1* | 5/2004 | Cheng | H01S 5/18305 |
| | | | 438/22 |
| 2005/0025211 A1* | 2/2005 | Zhang | H01S 5/423 |
| | | | 372/101 |
| 2008/0013329 A1* | 1/2008 | Takeda | F21S 41/663 |
| | | | 362/459 |
| 2009/0285253 A1* | 11/2009 | Masui | H01S 5/1833 |
| | | | 372/45.01 |
| 2013/0034117 A1 | 2/2013 | Hibbs-Brenner et al. | |
| 2016/0254638 A1 | 9/2016 | Chen et al. | |
| 2018/0212404 A1* | 7/2018 | Enzmann | H01S 5/0217 |
| 2019/0199063 A1 | 6/2019 | Barve et al. | |
| 2020/0328574 A1* | 10/2020 | Pai | H01S 5/1833 |
| 2023/0108210 A1 | 4/2023 | Kesler | |

* cited by examiner

VERTICALLY OFFSET VERTICAL CAVITY SURFACE EMITTING LASERS

CROSS-REFERENCE TO RELATED APPLICATION

This patent application claims priority to U.S. Provisional Patent Application No. 63/261,697, filed on Sep. 27, 2021, and entitled "VERTICALLY-OFFSET SINGLE-SUBSTRATE SINGLE-CHIP VERTICAL CAVITY SURFACE EMITTING LASERS." This patent application also claims priority to U.S. Provisional Patent Application No. 63/261,699, filed on Sep. 27, 2021, and entitled "BI-DIRECTIONAL VERTICAL CAVITY SURFACE EMITTING LASER CHIP." The disclosures of the prior applications are considered part of and are incorporated by reference into this patent application.

TECHNICAL FIELD

The present disclosure relates generally to lasers and to vertically offset vertical cavity surface emitting lasers (VCSELs).

BACKGROUND

A vertical-emitting device, such as a vertical cavity surface emitting laser (VCSEL), may include a laser, an optical transmitter, and/or the like in which a beam is emitted in a direction perpendicular to a surface of a substrate (e.g., vertically from a surface of a semiconductor wafer). Multiple vertical-emitting devices may be arranged in one or more emitter arrays (e.g., VCSEL arrays) on a common substrate.

SUMMARY

In some implementations, a vertical cavity surface emitting laser (VCSEL) device includes a substrate layer; a first set of epitaxial layers, for a first VCSEL, disposed on the substrate layer, the first set of epitaxial layers including: a first set of mirrors; and at least one first active layer; and a second set of epitaxial layers, for a second VCSEL, disposed on the first set of epitaxial layers for the first VCSEL, the second set of epitaxial layers including: a second set of mirrors; and at least one second active layer, where the first VCSEL and the second VCSEL are configured to emit light in a light emission direction, and where the at least one first active layer of the first VCSEL is offset in the light emission direction from the at least one second active layer of the second VCSEL.

In some implementations, a VCSEL array includes a substrate layer; a first set of epitaxial layers, for a plurality of first VCSELs, disposed on the substrate layer, the first set of epitaxial layers including: a first set of mirrors; and at least one first active layer; and a second set of epitaxial layers, for a plurality of second VCSELs, disposed on the first set of epitaxial layers for the plurality of first VCSELs, the second set of epitaxial layers including: a second set of mirrors; and at least one second active layer, where plurality of first VCSELs and the plurality of second VCSELs are configured to emit light in a light emission direction, and where a surface of the first set of epitaxial layers is offset in the light emission direction from a surface of the second set of epitaxial layers.

In some implementations, a method includes growing, on a substrate layer, a first set of epitaxial layers for a first VCSEL, the first set of epitaxial layers including: a first set of mirrors; and at least one first active layer; growing, on the first set of epitaxial layers, a second set of epitaxial layers for a second VCSEL, the second set of epitaxial layers including: a second set of mirrors; and at least one second active layer; and etching a portion of the second set of epitaxial layers until a surface of the first set of epitaxial layers is exposed, where the first VCSEL and the second VCSEL are configured to emit light in a light emission direction, and where the at least one first active layer of the first VCSEL is offset in the light emission direction from the at least one second active layer of the second VCSEL.

DETAILED DESCRIPTION

Figure 1A:
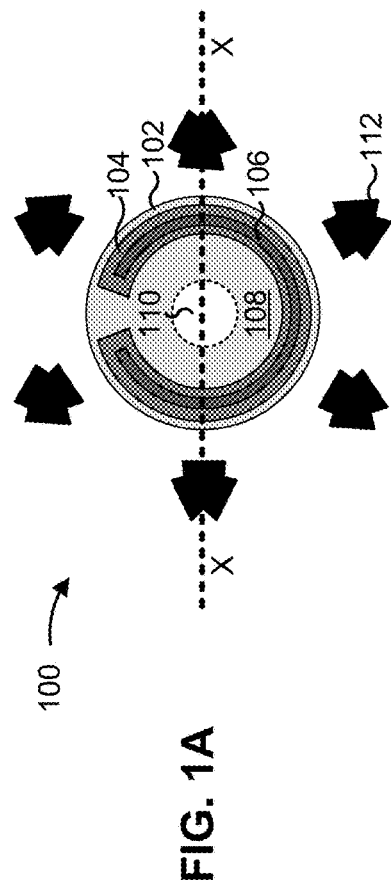
FIGS. 1A and 1B are diagrams depicting a top-view of an example emitter and a cross-sectional view of the example emitter along the line X-X, respectively.

The following detailed description of example implementations refers to the accompanying drawings. The same reference numbers in different drawings may identify the same or similar elements.

Vertical cavity surface emitting laser (VCSEL) modules for applications such as structured light, time-of-flight (ToF), and light detection and ranging (LIDAR) may use multiple VCSEL chips in the same housing. In some examples, different VCSEL chips in a VCSEL module may be vertically offset using an interposer of a height that is based on the particular functions of different optical components of the module (e.g., diffusing the output of one chip and collimating/splitting the output of another chip to form a spot field). Moreover, a VCSEL module may utilize different VCSEL array types (e.g., a flood array and a structured light array), and therefore the VCSEL module may need to employ independent, separate chips for each array type.

When VCSEL chips are placed in the same module there is also a requirement for precise alignment between the chips and, in some applications, a requirement that the chips be offset vertically from each other by a particular amount (e.g., using an interposer). This introduces potential alignment issues, and the performance of the module may be limited by the fabrication and placement tolerances of parts other than the VCSEL chips (e.g., the thickness tolerance or accuracy of the interposer). One way to relax the need for alignment accuracy is to fabricate a larger VCSEL chip with all required emitter patterns and VCSEL arrays on the chip. However, this would not allow for the use of an interposer and may result in greater module and manufacturing complexity. Moreover, for the larger VCSEL chip, the epitaxy would need to be identical for the different VCSEL arrays, which is undesirable if the VCSEL arrays need different epitaxial designs for tailoring performance.

Some implementations described herein provide multiple vertically offset (e.g., stacked) VCSELs on a single chip. In some implementations, a first set of epitaxial layers for one or more first VCSELs may be disposed on a substrate layer (e.g., a wafer), and a second set of epitaxial layers for one or more second VCSELs may be disposed on the first set of epitaxial layers. For example, multiple full VCSEL epitaxial stacks may be grown on the same substrate layer, and a lower VCSEL stack may be exposed during fabrication to produce vertically offset VCSELs. In this arrangement, a total thickness of the epitaxy between active regions of the different VCSEL stacks, which can be accurately controlled by the epitaxial growth process, may function as an interposer. Moreover, combining multiple VCSEL arrays onto a single VCSEL chip, without the use of external housing components, improves module fabrication tolerances by utilizing the nanometer-level thickness precision of epitaxial growth techniques and eliminating additional VCSEL-to-VCSEL alignment steps. In this way, the spacing between VCSELs is de-coupled from accuracy limitations of a pick-and-place tool and/or accuracy limitations of a chip bonding process, and rather the spacing between VCSELs is a function of the lithography accuracy during fabrication.

Furthermore, implementations described herein enable the use of different epitaxial designs, vertically offset from each other, on the same chip. For example, multiple VCSELs on a single chip may utilize different quantities of active layers, different emission wavelengths, or the like. In this way, vertically offset VCSELs described herein may be used for dynamic power level operation (e.g., indoor/outdoor or multi-distance LIDAR ranging using different quantities of active layers per VCSEL) and/or may enable applications across a wide wavelength range from the same chip.

Figure 1B:
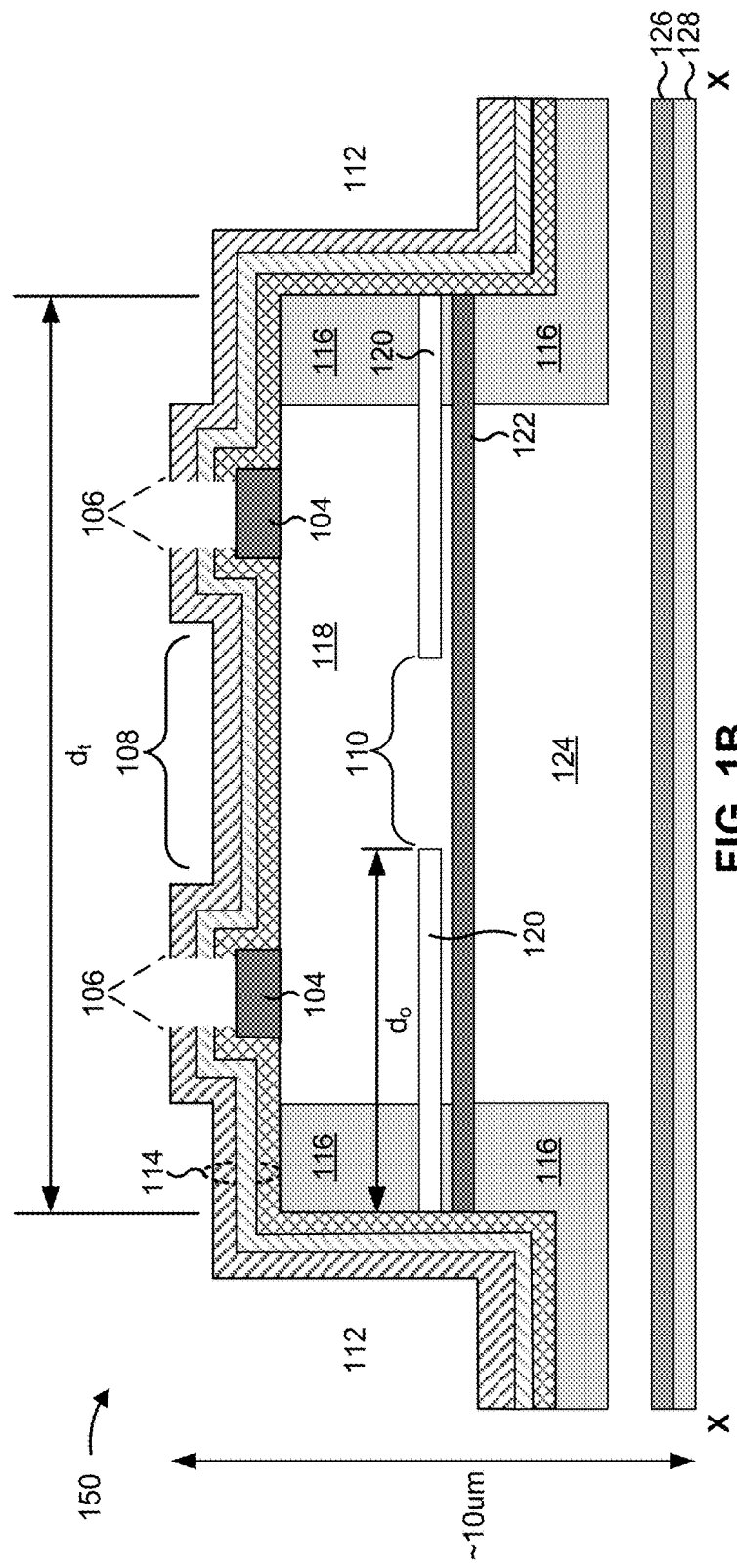

FIGS. 1A and 1B are diagrams depicting a top-view of an example emitter 100 and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g., a dielectric layer or a passivation layer) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, or another quantity of trenches. In some implementations, trench 112 may encircle emitter 100 to form a mesa structure associated with a distance di. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, and/or emission profile. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, emitter 100 may have, for example, a total height that is approximately 10 micrometers (μm).

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or another type of semiconductor layer.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 2:
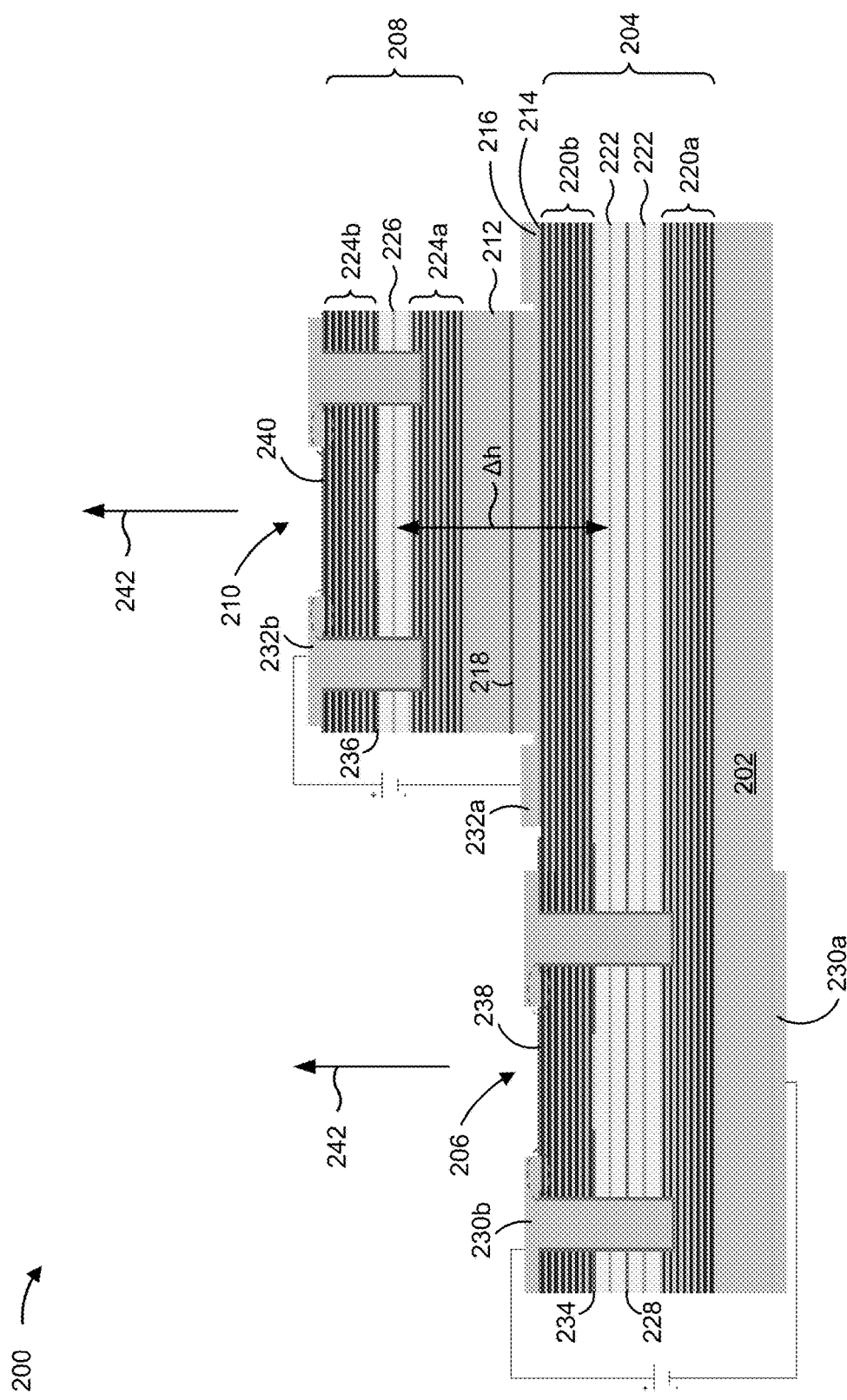
FIG. 2 is a diagram of an example vertical cavity surface emitting laser (VCSEL) device.

FIG. 2 is a diagram of an example VCSEL device 200. As shown in FIG. 2, the VCSEL device 200 may include a substrate layer 202, similarly as described above. In addition, the VCSEL device 200 may include a first set of epitaxial layers 204 for a first VCSEL 206 (e.g., one or more first VCSELs 206, such as a plurality of first VCSELs 206) disposed on the substrate layer 202, and the VCSEL device 200 may include a second set of epitaxial layers 208 for a second VCSEL 210 (e.g., one or more second VCSELs 210, such as a plurality of second VCSELs 210) disposed on the first set of epitaxial layers 204. The first set of epitaxial layers 204 and the second set of epitaxial layers may be independent, and thus the first VCSEL 206 and the second VCSEL 210 may be independent (e.g., electrically and optically). The first set of epitaxial layers 204 and/or the second set of epitaxial layers 208 may correspond to the emitter layers described in connection with FIGS. 1A-1B.

The VCSEL device 200 may include a bulk material layer 212 between the first set of epitaxial layers 204 and the second set of epitaxial layers 208. For example, the bulk material layer 212 may include a bulk semiconductor layer (e.g., GaAs), which may be lattice matched to the substrate layer 202 (e.g., the GaAs bulk semiconductor layer may be lattice matched to the GaAs substrate layer 202). In some implementations, the VCSEL device 200 may include an electrical isolation layer 214 (e.g., a semiconductor layer) between the first set of epitaxial layers 204 and the second set of epitaxial layers 208 (e.g., between the bulk material layer 212 and the first set of epitaxial layers 204). The electrical isolation layer 214 may include a material that provides electrical isolation. In some implementations, the VCSEL device 200 may include a contact layer 216 (e.g., a semiconductor layer) between the first set of epitaxial layers 204 and the second set of epitaxial layers 208 (e.g., between the bulk material layer 212 and the first set of epitaxial layers 204). The contact layer 216 may include a highly doped semiconductor material (e.g., an n++ material or a p++ material). The contact layer 216 may be disposed on the electrical isolation layer 214. In some implementations, the VCSEL device 200 may include a tunnel junction 218 between the first set of epitaxial layers 204 and one or more active layers, as described below, of the second set of epitaxial layers 208 (e.g., within the bulk material layer 212, within a bottom mirror of the second set of epitaxial layers 208, or the like, outside of the active regions of the first VCSEL 206 and the second VCSEL 210).

The tunnel junction 218 may flip a carrier type (e.g., from electrons (n-type) to holes (p-type)) between the first set of epitaxial layers 204 and the second set of epitaxial layers 208. In this way, the first set of epitaxial layers 204 and the second set of epitaxial layers 208 may both utilize a p-i-n structure and electrical driving scheme (e.g., to simplify manufacture of the VCSEL device 200). However, the first set of epitaxial layers 204 and the second set of epitaxial layers 208 are not limited to any particular structure. For example, the first set of epitaxial layers 204 and the second set of epitaxial layers 208 may include the same structure or different structures that may be any combination of p-i-n, n-i-p, n-p-i-n, or the like.

The first set of epitaxial layers 204 may include a first set of mirrors, shown as a first mirror 220a and a second mirror 220b. The first set of epitaxial layers 204 may include at least one first active layer 222 (e.g., a gain region) between the first mirror 220a and the second mirror 220b. The second set of epitaxial layers 208 may include a second set of mirrors, shown as a third mirror 224a and a fourth mirror 224b. The second set of epitaxial layers 208 may include at least one second active layer 226 (e.g., a gain region) between the third mirror 224a and the fourth mirror 224b. An active layer may include an active region where electrons and holes recombine to emit light. For example, an active region may include one or more quantum wells. An active layer may be located at a semiconductor junction of a set of epitaxial layers. A semiconductor junction may be a region at which oppositely-doped semiconductor material meets. For example, a first active layer and a second active layer of a set of epitaxial layers may be at a first p-n junction and a second p-n junction respectively. The first VCSEL 206 and/or the second VCSEL 210 may include two or more semiconductor junctions/active layers (e.g., the first VCSEL 206 and/or the second VCSEL 210 may be a multi-junction VCSEL). Here, a tunnel junction may be between consecutive active layers.

In some implementations, the first set of mirrors may include the first mirror 220a (e.g., a bottom mirror) and the second mirror 220b (e.g., a top mirror), and the second set of mirrors may include the third mirror 224a (e.g., a bottom mirror) and the fourth mirror 224b (e.g., a top mirror). In some implementations, the first set of mirrors may include a first mirror (e.g., the first mirror 220a) and a second mirror (e.g., a combination of the second mirror 220b and the third mirror 224a), and the second set of mirrors may include the second mirror and a third mirror (e.g., the fourth mirror 224b). For example, the bulk material layer 212 may be omitted, and the top mirror (or one or more layers thereof) of the first set of epitaxial layers 204 may be combined with the bottom mirror (or one or more layers thereof) of the second set of epitaxial layers 208 to form a shared mirror for the first set of epitaxial layers 204 and the second set of epitaxial layers 208. The shared mirror may have increased reflectivity, thereby reducing optical leakage between the first VCSEL 206 and the second VCSEL 210. Moreover, use of the shared mirror may reduce a time and complexity of manufacturing the VCSEL device 200. The first mirror 220a, the second mirror 220b, the third mirror 224a, or the fourth mirror 224b may be DBRs, as described herein.

In some implementations, a first bottom mirror (e.g., the first mirror 220a) of the first set of mirrors and a second bottom mirror (e.g., the third mirror 224a) of the second set of mirrors may be one of n-type or p-type, and a first top mirror (e.g., the second mirror 220b) of the first set of mirrors and a second top mirror (e.g., the fourth mirror 224b) of the second set of mirrors may be the other of n-type or p-type. For example, the first bottom mirror and the second bottom mirror may be n-type, and the first top mirror and the second top mirror may be p-type. Here, as described above, the VCSEL device 200 may include the tunnel junction 218 between the first set of epitaxial layers 204 and the second set of epitaxial layers 208. Thus, the first set of epitaxial layers 204 and the second set of epitaxial layers 208 may both utilize the same p-i-n structure, the same n-i-p structure, or the like. In some implementations, the first set of epitaxial layers 204 and the second set of epitaxial layers 208 may utilize different structures, and the tunnel junction 218 may be omitted.

The at least one first active layer 222 may include one or more active layers (e.g., two active layers, as shown), and the at least one second active layer 226 may include one or more active layers (e.g., one active layer, as shown). In some implementations, a first quantity of active layers of the first active layer(s) 222 is the same as a second quantity of active layers of the second active layer(s) 226. In some implementations, the first quantity of active layers of the first active layer(s) 222 is different from the second quantity of active layers of the second active layer(s) 226. In this way, an optical power of the first VCSEL 206 may be the same as or different from an optical power of the second VCSEL 210. As shown, the first set of epitaxial layers 204 includes multiple first active layers 222 and a tunnel junction 228 therebetween. The second set of epitaxial layers 208 may also include a tunnel junction in embodiments in which the second set of epitaxial layers 208 includes multiple second active layers 226.

In the example shown, the first VCSEL 206, having two active layers 222 (e.g., for higher slope efficiency), may be suitable for applications that use higher power or longer distance light emission, while the second VCSEL 210, having a single active layer 226 (e.g., for lower slope efficiency and/or for lower driver voltage and/or current operation), may be suitable for applications that use lower power or shorter distance light emission. Thus, the VCSEL device 200 may be used for multi-power applications, such as indoor/outdoor applications, short range/long range applications, or the like.

Although FIG. 2 shows the first VCSEL 206 (e.g., the lower VCSEL) as having a greater quantity of active layers than the second VCSEL 210 (e.g., the upper VCSEL), in some implementations, the second VCSEL 210 may have a greater quantity of active layers than the first VCSEL 206. However, as shown, the VCSEL with the greatest quantity of active layers (e.g., and therefore the largest heat load) may be positioned nearest to the substrate layer 202, and thus nearest to a heat sink (not shown). While the first VCSEL 206 and the second VCSEL 210 are described herein as having one or two active layers, the quantity of active layers that may be utilized in the first VCSEL 206 and the second VCSEL 210 is not limited to one or two active layers. For example, the first VCSEL 206 and/or the second VCSEL 210 may include three active layers, four active layers, five active layers, and/or six active layers, etc. Moreover, any combination of quantities of active layers may be used for the first VCSEL 206 and the second VCSEL 210 (e.g., because the first set of epitaxial layers 204 is independent of the second set of epitaxial layers 208).

The first VCSEL 206 and the second VCSEL 210 may be configured with an emission wavelength of 850 nanometers (nm), 905 nm, 940 nm, or greater than 1300 nm. In some implementations, an emission wavelength of the first VCSEL 206 may be the same as an emission wavelength of the second VCSEL 210. In some implementations, the emission wavelength of the first VCSEL 206 may be different from the emission wavelength of the second VCSEL 210. Here, the VCSEL device 200 may be used for multi-wavelength applications. For example, the VCSEL device 200 may provide shorter wavelength emission (e.g., 940 nm) and longer wavelength emission (e.g., greater than 1300 nm). In this way, the VCSEL device 200 may be used (e.g., simultaneously) for entirely different applications.

The VCSEL device 200 may include a first set of electrical contacts electrically connected to the first set of epitaxial layers 204. The first set of electrical contacts may include a bottom contact 230a (e.g., a cathode contact) and a top contact 230b (e.g., an anode contact). The bottom contact 230a may be disposed on a surface of the substrate layer 202 opposite the first set of epitaxial layers 204. The top contact 230b may be formed in one or more trenches that extend from a surface of the first set of epitaxial layers 204 to the first mirror 220a. The configuration for the first set of electrical contacts shown in FIG. 2 and described herein is provided as an example and other configurations are possible.

The VCSEL device 200 may include a second set of electrical contacts electrically connected to the second set of epitaxial layers 208. The second set of electrical contacts may include a bottom contact 232a (e.g., a cathode contact) and a top contact 232b (e.g., an anode contact). The bottom contact 232a may be disposed on the first set of epitaxial layers 204. For example, the bottom contact 232a may be disposed on the contact layer 216 or the electrical isolation layer 214. The top contact 232b may be disposed on a surface of the second set of epitaxial layers 208 (e.g., on the fourth mirror 224b) or may be formed in one or more trenches that extend from a surface of the second set of epitaxial layers 208 to the third mirror 224a. The configuration for the second set of electrical contacts shown in FIG. 2 and described herein is provided as an example and other configurations are possible.

The first set of electrical contacts and the second set of electrical contacts may be independent or connected together (e.g., depending on a driving scheme for the VCSEL device 200 that is employed). That is, the first VCSEL 206 and the second VCSEL 210 may be operated simultaneously or independently (e.g., based on a driving scheme that is employed and/or based on a manner in which the VCSELs are fabricated). For example, each VCSEL may be controlled independently by separate sets of contact layers that are deposited during fabrication of the VCSEL device 200.

In some implementations, the first set of epitaxial layers 204 may include an oxide layer 234 (e.g., between the first active layer(s) 222 and the second mirror 220b) that includes an oxide aperture, and the second set of epitaxial layers 208 may include an oxide layer 236 (e.g., between the second active layer(s) 226 and the fourth mirror 224b) that includes an oxide aperture, similarly as described above. In some implementations, an electrical isolation layer 238 may be disposed along a surface of the first set of epitaxial layers 204 (e.g., and line the one or more trenches for the top contact 230b), and an electrical isolation layer 240 may be disposed along a surface of the second set of epitaxial layers 208 (e.g., and line the one or more trenches for the top contact 232b). The electrical isolation layers 238, 240 may include portions of electrical isolation removal (shown by dashed ovals) to facilitate electrical connection of the top contacts 230b, 232b to the first set of epitaxial layers 204 and the second set of epitaxial layers 208, respectively.

The first VCSEL 206 and the second VCSEL 210 may be configured to emit light in a light emission direction 242. For example, the first VCSEL 206 and the second VCSEL 210 may both be configured for top emission. As another example, the first VCSEL 206 and the second VCSEL 210 may both be configured for bottom emission.

Moreover, the first VCSEL 206 and the second VCSEL 210 may be offset (e.g., vertically offset) in the light emission direction 242 (by an amount shown by Δh). For example, the first active layer(s) 222 (or an oxide layer, a tunnel junction, a bottom mirror, or a top mirror of the first set of epitaxial layers) may be offset (e.g., vertically offset) in the light emission direction 242 from the second active layer(s) 226 (or an oxide layer, a tunnel junction, a bottom mirror, or a top mirror of the second set of epitaxial layers). Stated another way, a surface of the first set of epitaxial layers 204 may be offset in the light emission direction 242 from a surface of the second set of epitaxial layers 208. Accordingly, the epitaxy between active regions (e.g., optical cavities) of the first VCSEL 206 and the second VCSEL 210, respectively, may function as an interposer (e.g., where a height of the interposer corresponds to the amount of offset Δh between the first VCSEL 206 and the second VCSEL 210). In this way, the height of the interposer may be accurately controlled by the epitaxial growth process. In some implementations, a thickness of the bulk material layer 212 may be used to adjust the height of the interposer. The interposer may facilitate integration of the VCSEL device 200 with various optical elements (e.g., the interposer may enable the optics to diffuse the light of the first VCSEL 206 and focus the light of the second VCSEL 210).

In some implementations, Δh may be greater than or equal to 100 μm (e.g., to enable the epitaxy between active regions of the first VCSEL 206 and the second VCSEL 210, respectively, to function as an interposer). In some implementations (e.g., in implementations where the top mirror of the first set of epitaxial layers 204 is combined with the bottom mirror of the second set of epitaxial layers 208, thereby reducing the need for a full bottom mirror stack, as described herein), Δh may be in a range from 1 μm to 10 μm, such as from 1 μm to 4 μm. In some implementations (e.g., in implementations where the first set of epitaxial layers 204 and the second set of epitaxial layers 208 employ separate sets of mirrors, as described herein), Δh may be in a range from 5 μm to 15 μm based on respective emission wavelengths of the first VCSEL 206 and the second VCSEL 210 and/or respective mirror reflectivities of the first set of mirrors of the first VCSEL 206 and the second set of mirrors of the second VCSEL 210.

In some implementations, an emission area of the first VCSEL 206 and an emission area of the second VCSEL 210 are offset in a direction orthogonal to the light emission direction 242, as shown in FIG. 2. That is, the emission area of the first VCSEL 206 and the emission area of the second VCSEL 210 may be horizontally offset. In some implementations, the emission area of the first VCSEL 206 and the emission area of the second VCSEL 210 are aligned in the direction orthogonal to the light emission direction 242, as described below.

In the VCSEL device 200, the first VCSEL 206 and the second VCSEL 210 are optically independent. In other words, there may be complete optical separation between an optical cavity of the first VCSEL 206 and an optical cavity of the second VCSEL 210, as optical leakage between the first VCSEL 206 and the second VCSEL 210 may affect the performance of the second VCSEL 210 (e.g., the VCSEL that is stacked on top of another VCSEL). For example, the bottom mirror of the second VCSEL 210, alone or in combination with the top mirror of the first VCSEL 206, may increase the reflectivity of a longitudinal mode of the second VCSEL 210 to prevent optical leakage from the second VCSEL 210 to the first VCSEL 206.

The VCSEL device 200 may be implemented as a single chip that includes the multiple vertically offset VCSELs 206, 210. That is, the multiple VCSELs 206, 210 may share a single, common substrate layer 202 (e.g., a single, common wafer). Thus, the VCSEL device 200 provides integration of VCSELs of different optical powers (e.g., different quantities of active layers) and/or different emission wavelengths in a single chip.

As indicated above, FIG. 2 is provided as an example. Other examples may differ from what is described with regard to FIG. 2.

Figure 3:
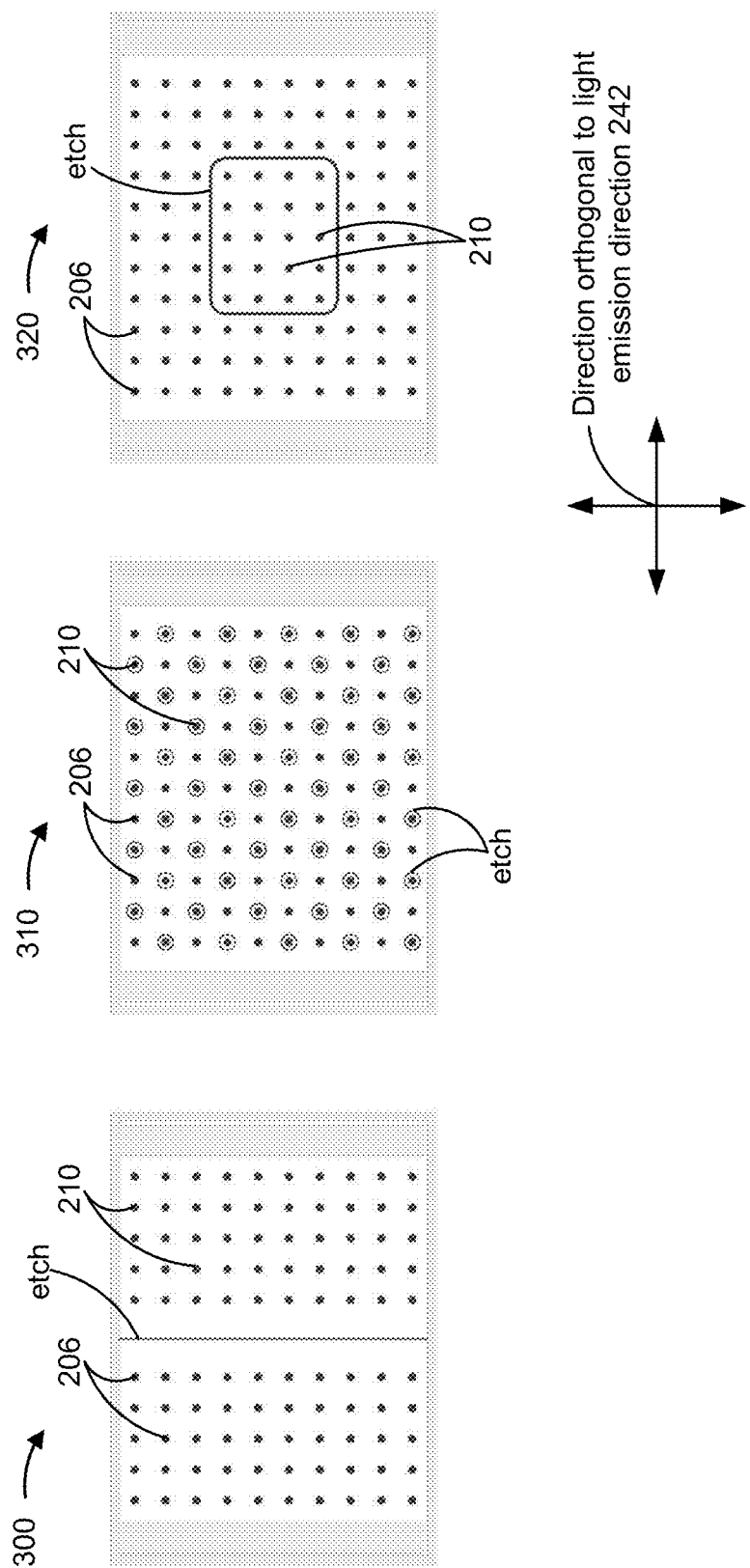
FIG. 3 is a diagram of example VCSEL arrays.

FIG. 3 is a diagram of example VCSEL arrays 300, 310, and 320. The VCSEL arrays 300, 310, and 320 may include the VCSEL device 200, or another VCSEL device described herein. For example, the VCSEL arrays 300, 310, and 320 may include the first set of epitaxial layers 204 for a plurality of first VCSELs 206 and the second set of epitaxial layers 208 for a plurality of the second VCSELs 210. As shown, the VCSEL arrays 300, 310, and 320 may be arranged into various patterns for the plurality of first VCSELs 206 and the plurality of second VCSELs 210 (some of which could not be achieved using separate VCSEL chips). The patterns shown in FIG. 3 are provided as examples, and in some implementations, a VCSEL array may utilize a pattern different from that shown in FIG. 3.

In the VCSEL array 300, the plurality of first VCSELs 206 and the plurality of second VCSELs 210 may be separated onto different sections of a chip (e.g., left and right sections, top and bottom sections, or the like). For example, the plurality of first VCSELs 206 may be positioned to a first side of a line that sections the VCSEL array 300 (e.g., into equal sections, or into unequal sections), and the plurality of second VCSELs 210 may be positioned to a second side of the line, in a direction orthogonal to the light emission direction 242. The line may represent a starting position of an etch of the second set of epitaxial layers 208 that exposes a surface of the first set of epitaxial layers 204.

In the VCSEL array 310 and in the VCSEL array 320, the plurality of first VCSELs 206 and the plurality of second VCSELs 210 are intermixed. For example, the plurality of first VCSELs 206 may be arranged in a first pattern, and the plurality of second VCSELs 210 may be arranged in a second pattern. In the VCSEL array 310, the plurality of first VCSELs 206 may be interleaved with the plurality of second VCSELs 210 in a uniform pattern (e.g., each row and each column of the VCSEL array 310 alternates between the plurality of first VCSELs 206 and the plurality of second VCSELs 210). However, in some implementations, the plurality of first VCSELs 206 are interleaved with the plurality of second VCSELs 210 in a random pattern or in a quasi-random pattern. In other words, the first pattern of the plurality of first VCSELs 206 is interleaved with the second pattern of the plurality of second VCSELs 210 in the direction orthogonal to the light emission direction 242. In the VCSEL array 310, etches of the second set of epitaxial layers 208 may expose (e.g., surround) individual VCSELs in the first set of epitaxial layers 204. In some implementations, the etches of the second set of epitaxial layers 208 may expose multiple VCSELs in the first set of epitaxial layers 204 (e.g., the etches expose particular sections of a surface of the first set of epitaxial layers 204).

In the VCSEL array 320, the plurality of first VCSELs 206 surround (e.g., centrally, as shown, or offset from center) the plurality of second VCSELs 210. In other words, the first pattern of the plurality of first VCSELs 206 surrounds the second pattern of the plurality of second VCSELs 210 in the direction orthogonal to the light emission direction 242. Here, an etch of the second set of epitaxial layers 208 may expose the plurality of first VCSELs 206 in the first set of epitaxial layers 204. In some implementations, the plurality of first VCSELs 206 may surround multiple groups of the plurality of second VCSELs 210. In some implementations, the plurality of second VCSELs 210 may surround the plurality of first VCSELs 206 in a similar manner.

In this way, a single optical component (e.g., that includes the VCSEL array 300, 310, or 320) may provide intermixing of different optical power levels and/or wavelengths with reduced module size and module complexity. For example, a single diffuser may be used with the VCSEL array 310 to generate a low power flash of light (e.g., from the plurality of second VCSELs 210 that include a single active layer) or a high power flash of light (e.g., from the plurality of first VCSELs 206, that include two active layers) based on lighting conditions. Moreover, if the plurality of first VCSELs 206 and the plurality of second VCSELs 210 emit light at different wavelengths, then the plurality of first VCSELs 206 and the plurality of second VCSELs 210 may be operated simultaneously to generate an overlapping flash of light or an interleaved field of spots for increased resolution or simultaneous multi-application measurement.

As indicated above, FIG. 3 is provided as an example. Other examples may differ from what is described with regard to FIG. 3.

Figure 4:
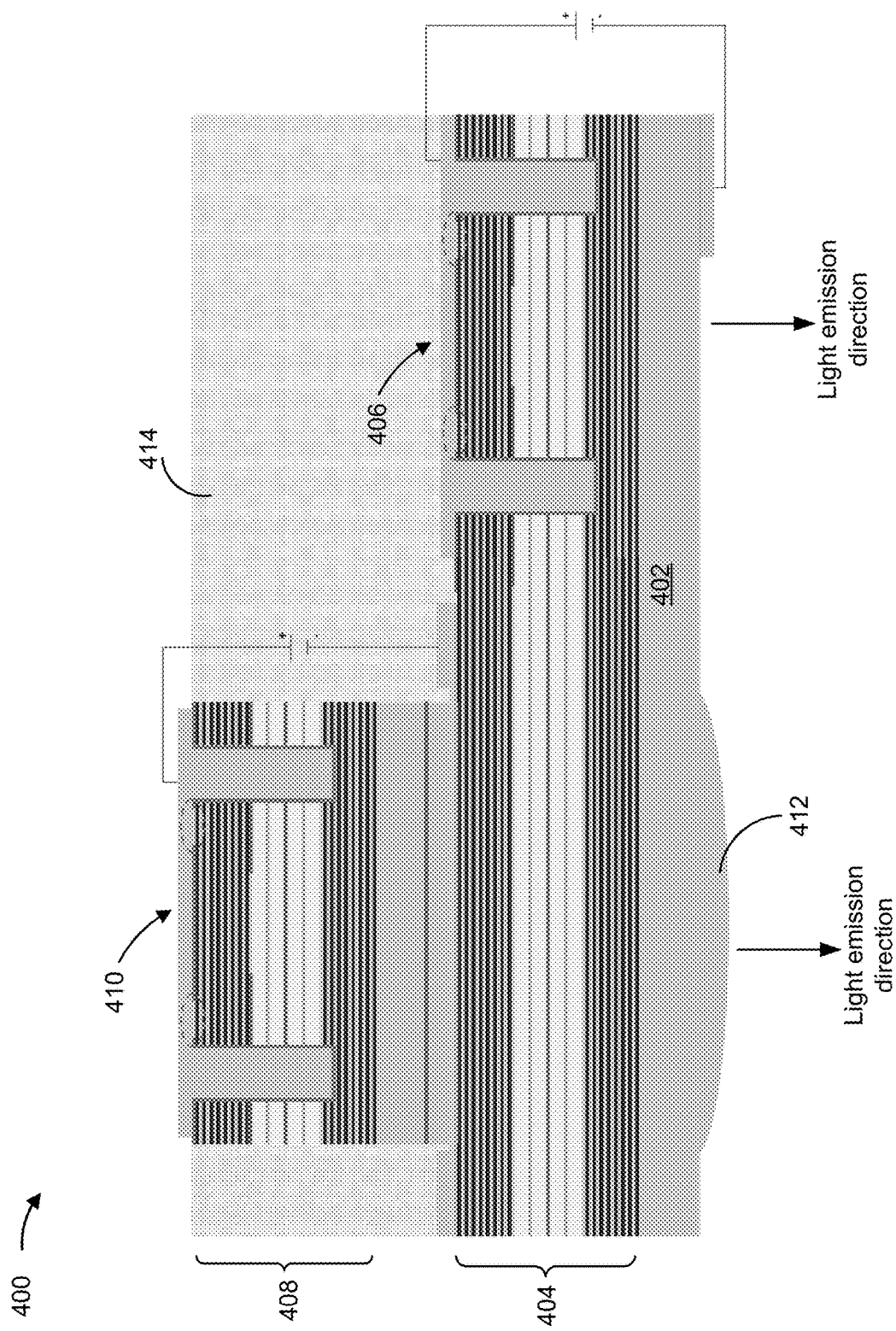
FIG. 4 is a diagram of an example VCSEL device.

FIG. 4 is a diagram of an example VCSEL device 400. As shown in FIG. 4, the VCSEL device 400 may include a substrate layer 402, similarly as described above. In addition, the VCSEL device 400 may include a first set of epitaxial layers 404 for a first VCSEL 406 (e.g., one or more first VCSELs 406, such as a plurality of first VCSELs 406) disposed on the substrate layer 402, and the VCSEL device 400 may include a second set of epitaxial layers 408 for a second VCSEL 410 (e.g., one or more second VCSELs 410, such as a plurality of second VCSELs 410) disposed on the first set of epitaxial layers 404. As shown, the first VCSEL 406 and the second VCSEL 410 may be in bottom-emitting configurations. The VCSEL device 400, including the first set of epitaxial layers 404 and the second set of epitaxial layers 408, may be configured in a similar manner as described in connection with the VCSEL device 200.

In the bottom-emitting configuration, a surface of the substrate layer 402, opposite the first set of epitaxial layers 404, may include one or more optical elements 412 (e.g., lenses). That is, the one or more optical elements 412 may be integrated into the substrate layer 402. Here, the substrate layer 402 may have a thickness of greater than or equal to 50 μm (e.g., based on a configuration of the one or more optical elements 412). In some implementations, as shown, an optical element 412 may be for the second VCSEL 410

(e.g., a light emission from the second VCSEL 410 may be directed at the optical element 412). In some implementations, an optical element 412 may be for the first VCSEL 406. In some implementations, respective optical elements 412 may be for the first VCSEL 406 and the second VCSEL 410.

In some implementations, the VCSEL device 400 may include a planarizing element 414. The planarizing element 414 may include a material such as a polymer, a metal, or a combination thereof. The planarizing element 414 may be disposed on the first set of epitaxial layers 404 (e.g., disposed on one or more electrical contacts, one or more electrical isolation layers, and/or one or more contact layers that are disposed on the first set of epitaxial layers 404). The planarizing element 414 may fill a void space left after etching the second set of epitaxial layers 408 to expose the first set of epitaxial layers 404. In this way, the planarizing element 414 may facilitate flip-chip bonding of the VCSEL device 400 to a substrate.

As indicated above, FIG. 4 is provided as an example. Other examples may differ from what is described with regard to FIG. 4.

Figure 5:
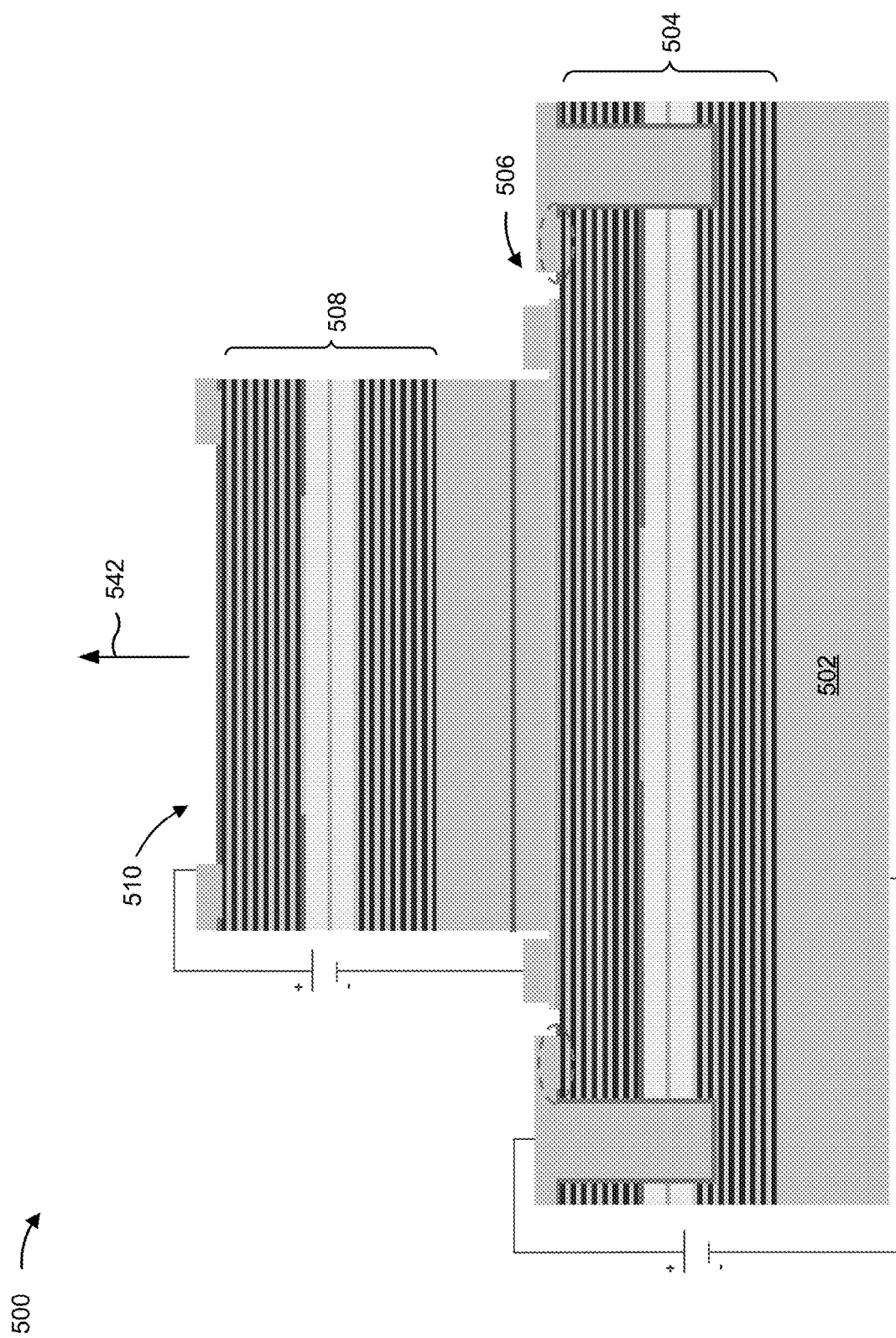
FIG. 5 is a diagram of an example VCSEL device.

FIG. 5 is a diagram of an example VCSEL device 500. As shown in FIG. 5, the VCSEL device 500 may include a substrate layer 502, similarly as described above. In addition, the VCSEL device 500 may include a first set of epitaxial layers 504 for a first VCSEL 506 (e.g., one or more first VCSELs 506, such as a plurality of first VCSELs 506) disposed on the substrate layer 502, and the VCSEL device 500 may include a second set of epitaxial layers 508 for a second VCSEL 510 (e.g., one or more second VCSELs 510, such as a plurality of second VCSELs 510) disposed on the first set of epitaxial layers 504. The VCSEL device 500, including the first set of epitaxial layers 504 and the second set of epitaxial layers 508, may be configured in a similar manner as described in connection with the VCSEL device 200. The first VCSEL 506 and the second VCSEL 510 may be driven independently or simultaneously.

As shown in FIG. 5, the emission area of the first VCSEL 506 and the emission area of the second VCSEL 510 are aligned in a direction orthogonal to a light emission direction 542. That is, the first VCSEL 506 and the second VCSEL 510 (e.g., which are optically uncoupled) may emit light from the same spatial location. Here, an emission wavelength of the first VCSEL 506 may be different from an emission wavelength of the second VCSEL 510. The emission wavelength of the first VCSEL 506 may be in a low reflectivity region (e.g., outside of a high reflectivity stop band) of a set of mirrors of the second VCSEL 510. Moreover, the second VCSEL 510 (which is designed based on the emission wavelength of the second VCSEL 510) may be configured to be non-resonant with the emission wavelength of the first VCSEL 506. In this way, the second VCSEL 510 does not optically interfere with the output wavelength of the first VCSEL 506 to facilitate multi-wavelength operation from a single spatial location.

As indicated above, FIG. 5 is provided as an example. Other examples may differ from what is described with regard to FIG. 5.

In some implementations, the VCSEL device 200, the VCSEL device 400, and/or the VCSEL device 500 may include more than two VCSELs (e.g., more than two sets of epitaxial layers) that are vertically offset in the manner described herein (e.g., the VCSEL device 200, 400, and/or 500 may include a lower VCSEL, a middle VCSEL, and an upper VCSEL). In some implementations, the VCSEL device 200, the VCSEL device 400, and/or the VCSEL device 500 may employ a type of vertically-emitting device other than a VCSEL, as described herein.

In some implementations, a module may include the VCSEL device 200, the VCSEL device 400, and/or the VCSEL device 500. For example, the VCSEL device 200, the VCSEL device 400, and/or the VCSEL device 500 may be disposed in a housing with one or more additional electrical components (e.g., circuitry for driving the VCSEL device 200, the VCSEL device 400, and/or the VCSEL device 500) and/or optical components (e.g., optical elements, such as lenses, diffusers, diffractive optical elements, or the like). In some implementations, an optical source (e.g., for three-dimensional sensing (3DS) or LIDAR) may include the VCSEL device 200, the VCSEL device 400, and/or the VCSEL device 500. In some implementations, an optical system may include the VCSEL device 200, the VCSEL device 400, and/or the VCSEL device 500. Moreover, the optical system may include one or more lenses, one or more optical elements (e.g., diffractive optical elements, refractive optical elements, or the like), one or more reflector elements, and/or one or more optical sensors, among other examples.

Figure 6:
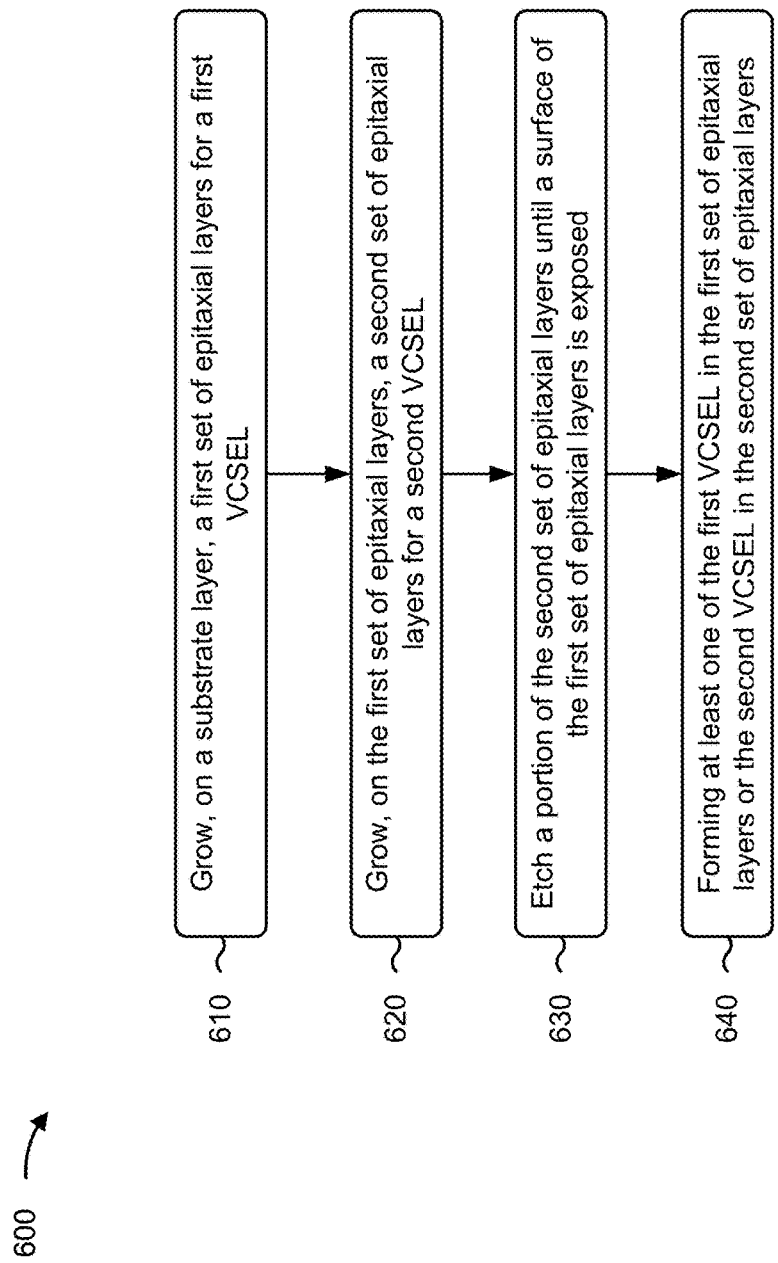
FIG. 6 is a flowchart of an example process for forming vertically offset VCSELs, as described herein.

FIG. 6 is a flowchart of an example process 600 for forming vertically offset VCSELs, as described herein.

As shown in FIG. 6, process 600 may include growing, on a substrate layer, a first set of epitaxial layers for a first VCSEL (e.g., a lower VCSEL) (block 610). The substrate layer may correspond to the substrate layer 202, 402, or 502. The first set of epitaxial layers may correspond to the first set of epitaxial layers 204, 404, or 504. As further shown in FIG. 6, process 600 may include growing, on the first set of epitaxial layers, a second set of epitaxial layers for a second VCSEL (e.g., an upper VCSEL) (block 620). The second set of epitaxial layers may correspond to the second set of epitaxial layers 208, 408, or 508. During growth in between respective sets of mirrors of the first set of epitaxial layers and the second set of epitaxial layers, limiting the epitaxial quality and thickness by the introduction of epitaxial dislocations or other strain effects should be avoided.

The first set of epitaxial layers and the second set of epitaxial layers may be grown during the same growth process on the same substrate layer. Moreover, the first set of epitaxial layers and the second set of epitaxial layers may be grown with different quantities of active layers and/or to emit light at different emission wavelengths. In some implementations, to configure different emission wavelengths for the first set of epitaxial layers and the second set of epitaxial layers, different growth processes may be used for the first set of epitaxial layers and the second set of epitaxial layers. For example, metal organic vapor phase epitaxy (MOVPE) and/or metal organic chemical vapor deposition (MOCVD) may be used to produce shorter wavelengths (e.g., 850 nm, 905 nm, and/or 940 nm), and molecular-beam epitaxy (MBE) may be used to produce longer wavelengths (e.g., greater than 1300 nm).

As further shown in FIG. 6, process 600 may include etching a portion of the second set of epitaxial layers until a surface of the first set of epitaxial layers is exposed (block 630). For example, to etch the portion of the second set of epitaxial layers, process 600 may include masking regions of the second set of epitaxial layers where operation (e.g., light emission) of the second VCSEL is desired and performing an etching process (e.g., wet etching, dry etching, or a combination thereof) to remove the second set of epitaxial layers in regions where operation (e.g., light emission) of the first VCSEL is desired. In some implementations, the second set of epitaxial layers may be etched to produce the pattern of VCSEL array 300, the pattern of VCSEL array 310, and/or the pattern of VCSEL array 320, among other examples.

As further shown in FIG. 6, process 600 may include forming at least one of the first VCSEL in the first set of epitaxial layers or the second VCSEL in the second set of epitaxial layers (block 640). Forming the first VCSEL and/or the second VCSEL may include depositing metal contacts for the first VCSEL and/or the second VCSEL, exposing an oxidation layer of the first VCSEL and/or the second VCSEL, or the like. In some implementations, the first VCSEL and the second VCSEL both may be formed after the etching described in connection with block 630. In some implementations, the second VCSEL may be formed prior to the etching described in connection with block 630, and the first VCSEL may be formed after the etching described in connection with block 630.

In some implementations, the first VCSEL and the second VCSEL may be formed independently. For example, the first VCSEL may be formed by masking regions of the VCSEL device other than a region for the first VCSEL, and the second VCSEL may be formed by masking regions of the VCSEL device other than a region for the second VCSEL. In some implementations, the first VCSEL and the second VCSEL may be formed simultaneously, for example, by simultaneously depositing respective metal contacts for each VCSEL and/or by simultaneously exposing respective oxidation layers of each VCSEL.

In this way, process 600 improves tolerances of the VCSEL device and eliminates the need for multiple wafers and/or multiple growth runs to produce a VCSEL device that is suitable for multi-power level applications and/or multi-wavelength applications.

Process 600 may include additional implementations, such as any single implementation or any combination of implementations described below and/or in connection with one or more other processes described elsewhere herein.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical cavity surface emitting laser (VCSEL) device, comprising:
    a substrate layer;
    a first set of epitaxial layers, for a first VCSEL, disposed on the substrate layer, the first set of epitaxial layers comprising:
        a first set of mirrors; and
        at least one first active layer;
    a second set of epitaxial layers, for a second VCSEL, separate from the first set of epitaxial layers and disposed on the first set of epitaxial layers, the second set of epitaxial layers comprising:
        a second set of mirrors; and
        at least one second active layer,
        wherein the first VCSEL and the second VCSEL are configured to emit light in a light emission direction,
        wherein the at least one first active layer is offset in the light emission direction from the at least one second active layer, and
        wherein the first VCSEL and the second VCSEL are configured to be operated independently; and
    two unique sets of electrical contacts that do not share a common electrical contact, wherein:
        a first set of electrical contacts, of the two unique sets of electrical contacts, is electrically connected to the first set of epitaxial layers, and
        a second set of electrical contacts, of the two unique sets of electrical contacts, is electrically connected to the second set of epitaxial layers.

2. The VCSEL device of claim 1, further comprising at least one of:
    an electrical isolation layer between the first set of epitaxial layers and the second set of epitaxial layers;

a contact layer between the first set of epitaxial layers and the second set of epitaxial layers; or a tunnel junction between the first set of epitaxial layers and the at least one second active layer.

3. The VCSEL device of claim 1, further comprising:
a bulk material layer between the first set of epitaxial layers and the second set of epitaxial layers.

4. The VCSEL device of claim 1, wherein the first set of mirrors comprise a first mirror and a second mirror, and
wherein the second set of mirrors comprise a third mirror and a fourth mirror.

5. The VCSEL device of claim 1, wherein a first emission area of the first VCSEL and a second emission area of the second VCSEL are offset in a direction orthogonal to the light emission direction.

6. The VCSEL device of claim 1, wherein a first emission area of the first VCSEL and a second emission area of the second VCSEL are aligned in a direction orthogonal to the light emission direction.

7. The VCSEL device of claim 6, wherein a first emission wavelength of the first VCSEL is different from a second emission wavelength of the second VCSEL.

8. The VCSEL device of claim 1, wherein a first quantity of active layers of the at least one first active layer is different from a second quantity of active layers of the at least one second active layer.

9. The VCSEL device of claim 1, wherein the first VCSEL and the second VCSEL are configured for bottom emission, and
wherein a surface of the substrate layer opposite the first set of epitaxial layers comprises an optical element for at least one of the first VCSEL or the second VCSEL.

10. The VCSEL device of claim 1, wherein the first VCSEL is horizontally offset, along a direction orthogonal to the light emission direction, from the second VCSEL.

11. A vertical cavity surface emitting laser (VCSEL) array, comprising:
a substrate layer;
a first set of epitaxial layers, for a plurality of first VCSELs, disposed on the substrate layer, the first set of epitaxial layers comprising:
a first set of mirrors; and
at least one first active layer;
a second set of epitaxial layers, for a plurality of second VCSELs, disposed on the first set of epitaxial layers, the second set of epitaxial layers comprising:
a second set of mirrors; and
at least one second active layer,
wherein the plurality of first VCSELs and the plurality of second VCSELs are configured to emit light in a light emission direction,
wherein a surface of the first set of epitaxial layers is offset in the light emission direction from a surface of the second set of epitaxial layers, and
wherein the plurality of first VCSELs and the plurality of second VCSELs are configured to be operated independently; and
two unique sets of electrical contacts that do not share a common electrical contact, wherein
a first set of electrical contacts, of the two unique sets of electrical contacts, is electrically connected to the first set of epitaxial layers, and
a second set of electrical contacts, of the two unique sets of electrical contacts, is electrically connected to the second set of epitaxial layers.

12. The VCSEL array of claim 11, wherein a first bottom mirror of the first set of mirrors and a second bottom mirror of the second set of mirrors are one of n-type or p-type,
wherein a first top mirror of the first set of mirrors and a second top mirror of the second set of mirrors are the other of n-type or p-type, and
wherein a tunnel junction is between the first set of epitaxial layers and the at least one second active layer.

13. The VCSEL array of claim 11, wherein a first quantity of active layers of the at least one first active layer is different from a second quantity of active layers of the at least one second active layer.

14. The VCSEL array of claim 11, wherein a first emission wavelength of the plurality of first VCSELs is different from a second emission wavelength of the plurality of second VCSELs.

15. The VCSEL array of claim 11, wherein the plurality of first VCSELs are arranged in a first pattern and the plurality of second VCSELs are arranged in a second pattern, and
wherein the first pattern is interleaved with the second pattern in a direction orthogonal to the light emission direction.

16. The VCSEL array of claim 11, wherein the plurality of first VCSELs are arranged in a first pattern and the plurality of second VCSELs are arranged in a second pattern, and
wherein the first pattern surrounds the second pattern in a direction orthogonal to the light emission direction.

17. The VCSEL array of claim 11, wherein a first VCSEL, of the plurality of first VCSELs, is horizontally offset from a second VCSEL, of the plurality of second VCSELs, along a direction orthogonal to the light emission direction.

18. A method, comprising:
growing, on a substrate layer, a first set of epitaxial layers for a first VCSEL, the first set of epitaxial layers comprising:
a first set of mirrors; and
at least one first active layer;
growing, on the first set of epitaxial layers, a second set of epitaxial layers for a second VCSEL, the second set of epitaxial layers comprising:
a second set of mirrors; and
at least one second active layer;
etching a portion of the second set of epitaxial layers until a surface of the first set of epitaxial layers is exposed,
wherein the first VCSEL and the second VCSEL are configured to emit light in a light emission direction,
wherein the at least one first active layer of the first VCSEL is offset in the light emission direction from the at least one second active layer of the second VCSEL, and
wherein the first VCSEL and the second VCSEL are configured to be operated independently; and
depositing two unique sets of metal contacts that do not share a common electrical contact, wherein
a first set of metal contacts, of the two unique sets of metal contacts, is electrically connected to the first set of epitaxial layers, and
a second set of metal contacts, of the two unique sets of electrical contacts, is electrically connected to the second set of epitaxial layers.

19. The method of claim 18, wherein depositing the two unique sets of metal contacts comprises:

depositing the first set of metal contacts for the first VCSEL and the second set of metal contacts for the second VCSEL after etching the portion of the second set of epitaxial layers.

20. The method of claim 18, wherein the first VCSEL is horizontally offset, along a direction orthogonal to the light emission direction, from the second VCSEL.

* * * * *